US012689370B2

(12) United States Patent
Yano

(10) Patent No.: US 12,689,370 B2
(45) Date of Patent: Jul. 21, 2026

(54) SEMICONDUCTOR SWITCH AND SEMICONDUCTOR CIRCUIT

(71) Applicant: UNIVERSITY OF YAMANASHI, Kofu (JP)

(72) Inventor: Koji Yano, Kofu (JP)

(73) Assignee: UNIVERSITY OF YAMANASHI, Yamanashi (JP)

( * ) Notice: Subject to any disclaimer, the term of this patent is extended or adjusted under 35 U.S.C. 154(b) by 269 days.

(21) Appl. No.: 18/713,801

(22) PCT Filed: Dec. 2, 2022

(86) PCT No.: PCT/JP2022/044571
§ 371 (c)(1),
(2) Date: May 28, 2024

(87) PCT Pub. No.: WO2023/106233
PCT Pub. Date: Jun. 15, 2023

(65) Prior Publication Data
US 2026/0172025 A1      Jun. 18, 2026

(30) Foreign Application Priority Data

Dec. 6, 2021    (JP) ................................. 2021-198011

(51) Int. Cl.
| | |
|---|---|
| *H03K 17/567* | (2006.01) |
| *H03K 17/0812* | (2006.01) |
| *H03K 17/16* | (2006.01) |
| *H03K 17/60* | (2006.01) |
| *H03K 17/687* | (2006.01) |

(52) U.S. Cl.
CPC ..... *H03K 17/687* (2013.01); *H03K 17/08122* (2013.01); *H03K 17/162* (2013.01);
(Continued)

(58) Field of Classification Search
CPC ......... H03K 17/0812; H03K 17/08122; H03K 17/08126; H03K 17/16; H03K 17/161;
(Continued)

(56) References Cited

U.S. PATENT DOCUMENTS

| | | | |
|---|---|---|---|
| 4,093,925 A | 6/1978 | Yokoyama | |
| 6,242,967 B1 * | 6/2001 | Iwamuro | .......... H03K 17/04126 327/575 |

(Continued)

FOREIGN PATENT DOCUMENTS

| | | |
|---|---|---|
| CN | 112993007 A | 6/2021 |
| JP | S52114643 U | 8/1977 |

(Continued)

OTHER PUBLICATIONS

International Search Report issued on Feb. 28, 2023, in corresponding International Application No. PCT/JP2022/044571; 8 pages.
(Continued)

*Primary Examiner* — Long Nguyen
(74) *Attorney, Agent, or Firm* — Maier & Maier, PLLC

(57) ABSTRACT

The object of the present invention is to provide a semiconductor switch and a semiconductor circuit having a higher degree of convenience. Provided is a semiconductor switch including a first transistor and a second transistor, the first transistor being a field-effect transistor, the second transistor being a superjunction bipolar junction transistor, wherein the first transistor and the second transistor are Darlington-connected in such a way that the first transistor to be the front stage.

4 Claims, 14 Drawing Sheets

100

(52) U.S. Cl.
CPC ........... *H03K 17/567* (2013.01); *H03K 17/60* (2013.01); *H03K 17/6871* (2013.01)

(58) Field of Classification Search
CPC ...... H03K 17/162; H03K 17/51; H03K 17/56; H03K 17/567; H03K 17/60; H03K 17/615; H03K 17/687; H03K 17/6871
See application file for complete search history.

(56) References Cited

U.S. PATENT DOCUMENTS

| | | | | |
|---|---|---|---|---|
| 8,541,787 | B2 * | 9/2013 | Zhang .................. | H10D 12/481 |
| | | | | 257/77 |
| 2013/0241628 | A1 | 9/2013 | Zhang | |
| 2015/0115315 | A1 | 4/2015 | Tse et al. | |
| 2023/0282694 | A1 | 9/2023 | Hashimoto et al. | |

FOREIGN PATENT DOCUMENTS

| | | | |
|---|---|---|---|
| JP | S5631902 | B2 | 7/1981 |
| WO | 2021090944 | A1 | 5/2021 |

OTHER PUBLICATIONS

International Preliminary Report on Patentability issued on Mar. 15, 2024, in corresponding International Application No. PCT/JP2022/044571; 16 pages.

* cited by examiner

Figure 3:
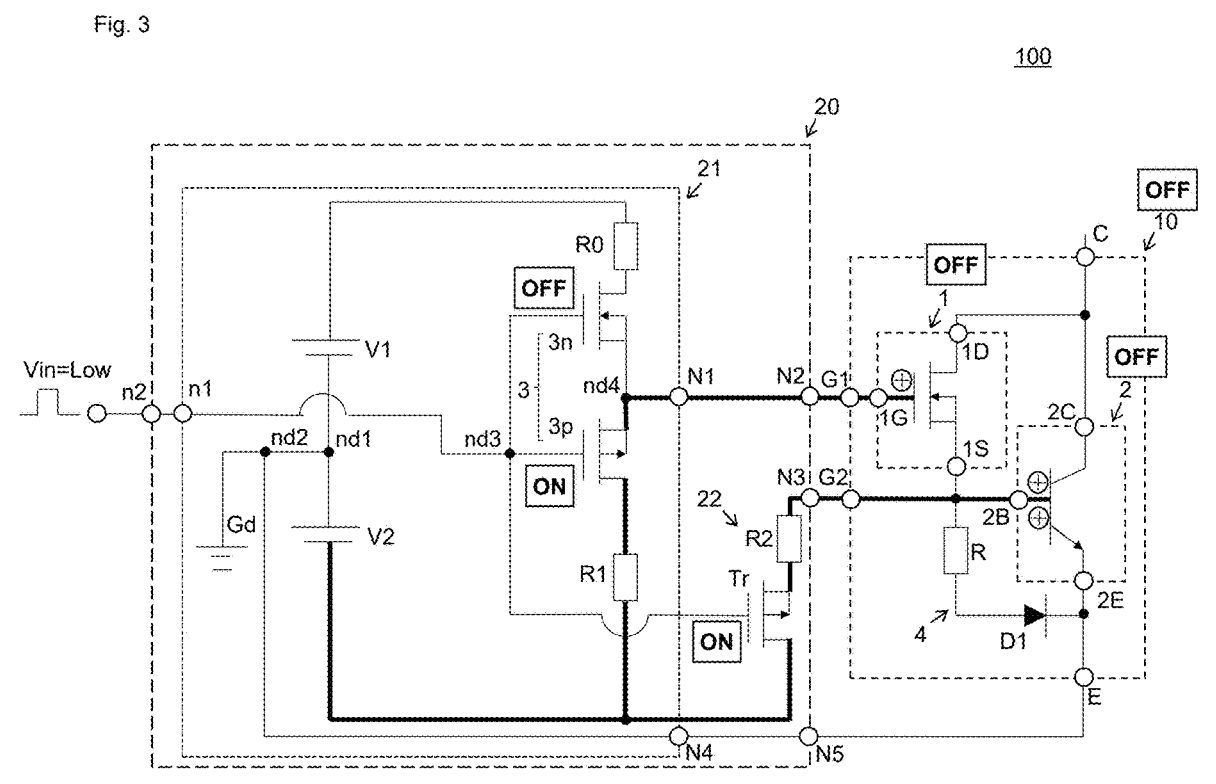

OFF

3n

3

3p

OFF

ON

Vin=Low n2 | n1

V1 nd2 | nd1

Gd

V2 nd3 nd4

N1

N2 | G1

1G

1D

1S

OFF

1

C

OFF

10

OFF

2

2C

2B

2E

E

N3 | G2

2

22

R2

Tr

R1

ON

R

4

D1

N4

N5

SEMICONDUCTOR SWITCH AND SEMICONDUCTOR CIRCUIT

TECHNICAL FIELD

The present invention relates to a semiconductor switch and a semiconductor circuit.

BACKGROUND ART

Patent literature 1 discloses bipolar junction transistors having super junction structure (SJBJT: superjunction bipolar junction transistor). SJBJTs exhibit low on-resistance, steep turn-off characteristics, and high blocking voltage characteristics, so they are expected to be applied to audios, relays, inverter circuits, and the like.

CITATION LIST

Patent Literature

[Patent Literature 1] International Publication No. WO 2021/090944

SUMMARY OF INVENTION

Technical Problem

The SJBJT described in Patent literature 1, which is a bipolar junction transistor, may be difficult to handle when used in semiconductor circuits, since bipolar junction transistors are required to be controlled by electric current.

The present invention has been made in view of the above circumstances, and an object of the present invention is to provide a semiconductor switch and a semiconductor circuit that are more convenient.

Solution to Problem

One aspect of the present invention provides a semiconductor switch including a first transistor and a second transistor, the first transistor being a field-effect transistor, the second transistor being a superjunction bipolar junction transistor. The first transistor and the second transistor are Darlington-connected such that the first transistor is located in the front stage.

According to the semiconductor switches of the present invention, the second transistor, which is a superjunction bipolar junction transistor, is Darlington-connected to the first transistor, which is a field effect transistor. And in this Darlington connection, the first transistor, which is a field-effect transistor, is located in the front stage.

This allows the semiconductor switches of the present invention to control the second transistor (superjunction bipolar junction transistor) via the first transistor, which can be voltage-controlled, for enhanced convenience.

The following are examples of various embodiments of the present invention. The embodiments shown below may be combined with one another.

Preferably, the semiconductor switch further includes a first to fourth terminals, wherein the first terminal is connected to a gate of the first transistor, the second terminal is connected to a base of the second transistor, the third terminal is connected to a drain of the first transistor and a collector of the second transistor, and the fourth terminal is connected to an emitter of the second transistor.

Preferably, the semiconductor switch further includes a branch including a shunt resistor, wherein the branch is connected to a base of the second transistor at one end and to an emitter of the second transistor at the other end.

Preferably, in the semiconductor switch, the branch further includes a diode having an anode connected to the base side of the second transistor and a cathode connected to the emitter side of the second transistor.

Another aspect of the present invention provides a semiconductor circuit including a semiconductor switch and a drive circuit. The semiconductor switch includes a first transistor and a second transistor, the first transistor being a field-effect transistor, the second transistor being a superjunction bipolar junction transistor. The drive circuit includes a signal input section which receives an input signal and a charge extraction unit. The first transistor and the second transistor are Darlington-connected such that the first transistor is located in the front stage, and the charge extraction unit is configured to make a potential of a base of the second transistor lower than a potential of an emitter of the second transistor when the semiconductor switch is turned off in response to the input signal.

Preferably, in the semiconductor circuit, the drive circuit further includes a first switch section connected to a gate of the first transistor, and a direct current voltage source connected to the first switch section. The signal input section is connected to the first switch section so that the input signal is input to the first switch section. The first switch section is configured to invert the polarity of the voltage supplied from the direct current voltage source to the semiconductor switch, depending on whether the input signal is a first voltage or a second voltage. The charge extraction unit is connected to the base of the second transistor. When the input signal is the first voltage, a predetermined voltage from the direct current voltage source is applied to the gate of the first transistor to turn on the semiconductor switch. In the transition of the input signal from the first voltage to the second voltage, charges in the gate of the first transistor are extracted to the direct current voltage source via the first switch section to turn off the semiconductor switch, and charges in the base of the second transistor are extracted to the negative pole of the direct current voltage source.

Preferably, in the semiconductor circuit, the drive circuit further includes a first resistor connected to the direct current voltage source and the first switch section. The charge extraction unit includes a second switch section connected to the direct current voltage source, and a second resistor connected to the base of the second transistor and the second switch section. The signal input section is connected to the second switch section so that the input signal is input to the second switch section. In the transition of the input signal from the first voltage to the second voltage, charges in the gate of the first transistor are extracted to the direct current voltage source via the first switch section and the first resistor, and the second switch section is turned on and charges in the base of the second transistor are extracted to the direct current voltage source via the second resistor and the second switch section.

Preferably, in the semiconductor circuit, the drive circuit further includes a first resistor connected to the direct current voltage source and the first switch section. The charge extraction unit includes an extraction diode whose anode is connected to the base of the second transistor and whose cathode is connected to the gate of the first transistor. In the transition of the input signal from the first voltage to the second voltage, charges in the gate of the first transistor are extracted to the direct current voltage source via the first switch section and the first resistor, and charges in the base of the second transistor are extracted to the direct current voltage source via the extraction diode and the first switch section.

BRIEF DESCRIPTION OF DRAWINGS

FIG. 1 is a circuit configuration diagram of a semiconductor circuit 100 including a semiconductor switch 10 according to the first embodiment.

FIG. 2 shows how a first transistor 1 turns ON, causing a second transistor 2 to turn ON (i.e., the semiconductor switch 10 turns ON). In FIG. 2, a conduction path between a direct current (DC) voltage source V1 and a gate 1G of the first transistor 1 is shown schematically with a bold line.

FIG. 3 illustrates the turn-off operation of the semiconductor switch 10, showing how the charge in the gate 1G of the first transistor and the charge in a base 2B of the second transistor are extracted to the negative pole of a DC voltage source V2. In FIG. 3, a conduction path between the negative pole of the DC voltage source V2, and the gate 1G of the first transistor and the base 2B of the second transistor is shown schematically with a bold line.

In FIG. 5, the specific circuit configuration of the drive circuit 20 is omitted.

FIG. 6 shows the turn-off characteristics of the semiconductor switch 10 when the resistance of a second resistor R2 is 10, 20, 30, and 47 o ohms (Ω), respectively. The various characteristics such as the collector current $I_c$ shown in FIG. 6 correspond not to the characteristics of the second transistor 2 itself, but to the semiconductor switch 10 as a whole, including the first and second transistors 1, 2.

In FIG. 8A, curve L1 shows the delay time $t_{d\_off}$ characteristic and curve L2 shows the fall time tf characteristic. In FIG. 8B, curve L1 shows the time rate of change di/dt characteristic of the collector current $I_c$, and curve L2 shows the time rate of change dV/dt characteristic of the voltage $V_{CE}$ between the collector and the emitter. In FIG. 8C, curve L1 shows the loss $E_{off}$ characteristic during turn-off of the semiconductor switch 10, and curve L2 shows the loss $E_{r2}$ generated in the second resistor R2 when $I_{bsj}$ flows in the second resistor R2 during turn-off. In FIG. 8D, curve L1 shows the charge QB characteristic, where the charge QB is accumulated in the on-state of the second transistor 2 and flows from the base 2B of the second transistor 2 to the negative pole side of the DC voltage source V2, and curve L2 shows the maximum value $I_{bsj,max}$ of the current $I_{bsj}$ flowing from the base 2B to the negative pole side of the DC voltage source V2. The various characteristics shown in FIGS. 8A through 8D are not the characteristics of the second transistor 2 itself, but of the semiconductor switch 10 as a whole, including the first and second transistors 1, 2. The same applies to FIG. 9 and other figures described below.

In FIG. 12C, curve L2 shows the loss $E_{r1}$ generated in the first resistor R1 when $I_{bsj}$ flows in the first resistor R1 during turn-off. In FIG. 12D, curve L1 shows the charge QB characteristic, where the charge QB indicates charge amount accumulated in the gate 1G of the first transistor 1 and the base 2B of the second transistor 2 in the on-state and flows to the negative pole of the DC voltage source V2. In FIG. 12D, curve L2 shows the maximum value $I_{bsj,max}$ of the current $I_{bsj}$ flowing from the gate 1G of the first transistor 1 and the base 2B of the second transistor 2 to the negative pole side of the DC voltage source V2. Other characteristics such as the delay time $t_{d\_off}$ and the fall time tf in FIG. 12A, the time rate of change di/dt and the time rate of change dV/dt in FIG. 12B, and the loss $E_{off}$ in FIG. 12C correspond to the characteristics described in FIGS. 8A, 8B, and 8C, respectively.

DESCRIPTION OF EMBODIMENTS

1. First Embodiment 1-1. Configuration Description

Figure 1:
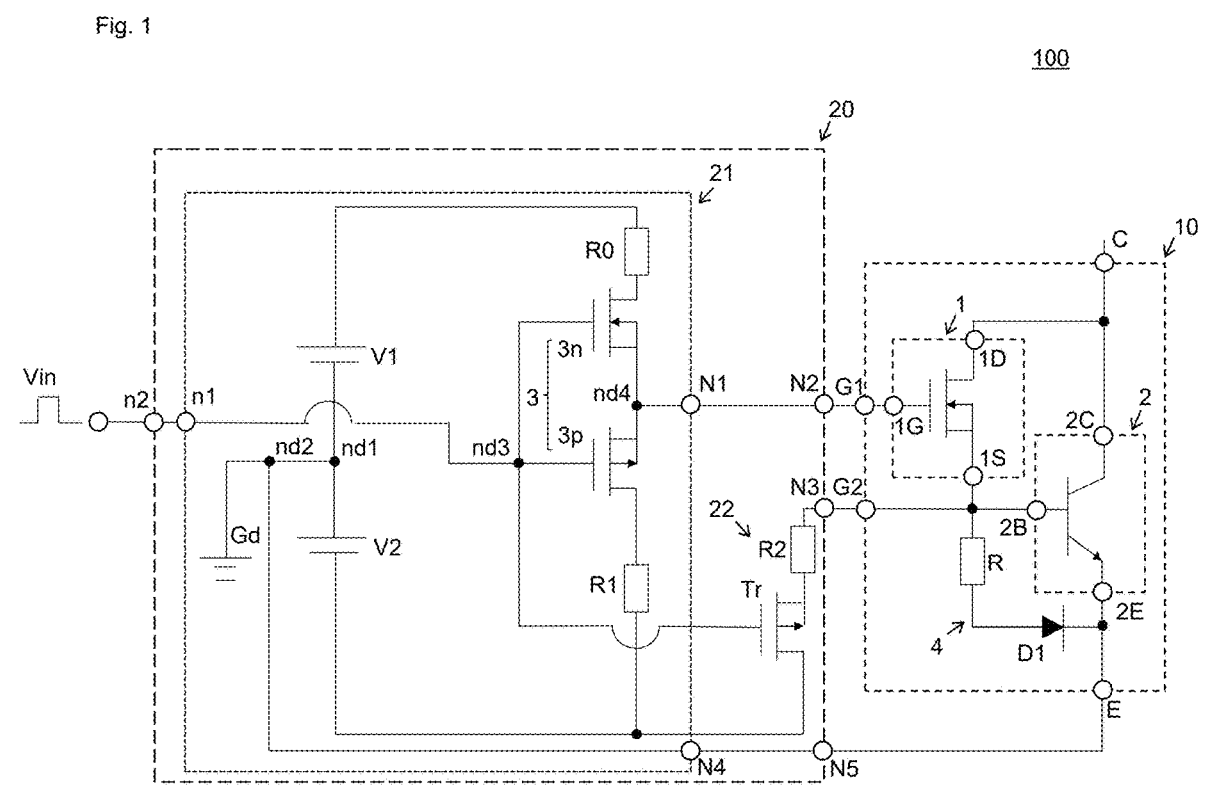
Figure 4:
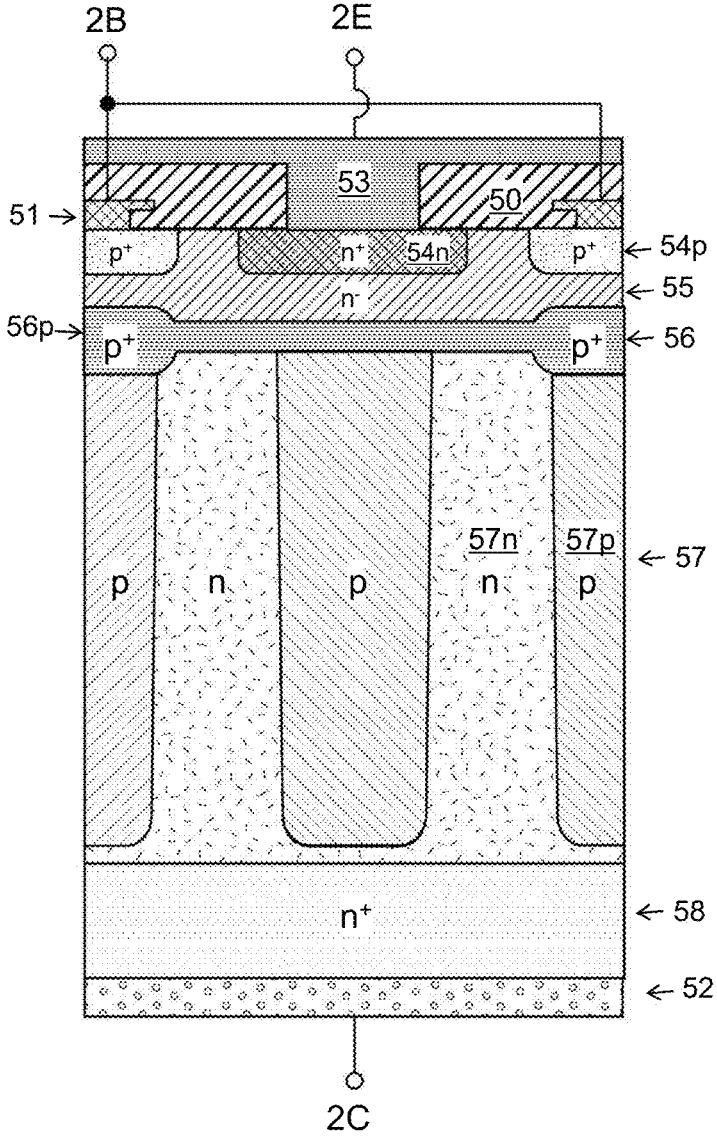
FIG. 4 illustrates the configuration of the second transistor 2 of the semiconductor switch 10 shown in FIG. 1.

As shown in FIG. 1, a semiconductor circuit 100 includes a semiconductor switch 10 (semiconductor switch circuit) and a drive circuit 20. The semiconductor switch 10 according to the first embodiment is electrically connected to the drive circuit 20 for driving (i.e., turning on or off) the semiconductor switch 10. The semiconductor circuit 100 is applicable to audio, relay and inverter circuits, for example.

1-1-1. Semiconductor Switch 10

The semiconductor switch 10 includes a first transistor 1, a second transistor 2, and a branch 4.

<First and Second Transistors 1, 2>

The first transistor 1 is configured as a metal-oxide-silicon field-effect transistor (MOSFET). In the first embodiment, the first transistor 1 is an n-channel MOSFET and has a gate 1G (gate electrode), a drain 1D (drain electrode) and a source 1S (source electrode).

The second transistor 2 is configured as a superjunction bipolar junction transistor (SJBJT). In the first embodiment, the second transistor 2 is an SJBJT and has a base 2B (base electrode), a collector 2C (collector electrode) and an emitter 2E.

The first transistor 1 and the second transistor 2 are Darlington-connected such that the first transistor 1 is located in the front stage. That is, the drain 1D of the first transistor 1 and the collector 2C of the second transistor 2 are connected to form a third terminal C of the semiconductor switch 10, and the source 1S of the first transistor 1 is connected to the base 2B of the second transistor 2.

<Branch 4>

The branch 4 is connected to the base 2B at one end and to the emitter 2E at the other end. In other words, the branch 4 is configured to connect the base 2B to the emitter 2E. The branch 4 has a shunt resistor R and a diode D1.

The shunt resistor R is provided to improve the switching performance and breakdown voltage of the semiconductor switch 10. The shunt resistor R is connected in series with the diode D1.

The diode D1 is arranged to prevent current flow from the emitter 2E to the base 2B. In other words, the anode of the diode D1 is connected to the base 2B side and the cathode of diode D1 is connected to the emitter 2E. The arrangement of the diode D1 and the shunt resistor R may be reversed.

<Four-terminal Structure of the Semiconductor Switch 10>

The semiconductor switch 10 has such a circuit configuration that includes four terminals, specifically, a first terminal G1, a second terminal G2, the third terminal C, and a fourth terminal E. The third terminal C corresponds to a collector of the semiconductor switch 10, and the first and second terminals G1 and G2 correspond to a gate of the semiconductor switch 10. The fourth terminal E corresponds to an emitter of the semiconductor switch 10.

The first terminal G1 is connected to the gate 1G of the first transistor 1. The second terminal G2 is connected to the source 1S of the first transistor 1 and the base 2B of the second transistor 2. The third terminal C is connected to the drain 1D of the first transistor 1 and the collector 2C of the second transistor 2. The fourth terminal E is connected to the emitter 2E of the second transistor 2.

<Cross-sectional Structure of the Second Transistor 2>

Next, a cross-sectional cell structure of the second transistor 2 is briefly described. The second transistor 2 has a cross-sectional structure as shown in FIG. 4. Specifically, the second transistor 2 has an insulating layer 50, a base electrode layer 51, a collector electrode layer 52, an emitter electrode layer 53, an n-type contact region 54n, a p-type contact region 54p, an n-type semiconductor layer 55, a p-type base layer 56, a superjunction layer 57 and an n-type semiconductor layer 58.

The base electrode layer 51 is formed on the surface of the p-type contact region 54p and is connected to the base 2B. The collector electrode layer 52 is formed on the surface of the n-type semiconductor layer 58 and is connected to the collector 2C. The emitter electrode layer 53 is formed on the surface of the n-type contact region 54n and is connected to the emitter 2E.

The p-type base layer 56 is formed on the superjunction layer 57. The p-type base layer 56 has a sinker 56p, which is located under the p-type contact region 54p. The sinker 56p is formed to ensure electrical connection with the p-type contact region 54p.

The p-type contact region 54p does not reach the p-type base layer 56 (and the sinker 56p), and the n-type semiconductor layer 55 is located between the p-type contact region 54p and the p-type base layer 56. However, the p-type contact region 54p and the p-type base layer 56 are electrically connected, and holes can be injected from the p-type contact region 54p to the p-type base layer 56. In other words, by adjusting the impurity concentration gradient in the p-n-p junction structure of the p-type contact region 54p, the n-type semiconductor layer 55, and the p-type base layer 56, hole injection is possible even when the p-type contact region 54p and the p-type base layer 56 are separated from each other.

The superjunction layer 57 has n-type regions 57n and p-type regions 57p, which are adjacent and alternate with each other. This structure, in which n-type regions 57n and p-type regions 57p are alternately arranged adjacent to each other, is called a superjunction structure. Superjunction structures are useful in that they can improve the trade-off characteristics between transistor on-resistance and breakdown voltage by increasing the ratio of pillar length to pillar width in each region. The superjunction layer 57 is formed between the p-type base layer 56 and the n-type semiconductor layer 58. The second transistor 2 has this superjunction structure, thus effects such as improving the breakdown voltage, reducing the resistance between the collector and emitter electrodes when the second transistor 2 is ON, and increasing the current gain are achieved. In addition, the tail current seen in conventional IGBTs and conventional bipolar junction transistors can be suppressed, and losses during turn-off can be reduced. The configuration of the second transistor 2 can be adopted from the configuration disclosed in International Publication No. 2021/090944.

1-1-2. Drive Circuit 20

The drive circuit 20 has a drive unit 21 and a charge extraction unit 22. In addition, the drive circuit 20 has terminals n2, N2, N3, and N5.

The terminal n2 is a terminal that receives the input signal Vin. The terminal n2 is an example of a signal input section.

The terminal N2 is connected to the first terminal G1 of the semiconductor switch 10, the terminal N3 is connected to the second terminal G2 of the semiconductor switch 10, and the terminal N5 is connected to the fourth terminal E of the semiconductor switch 10.

<Drive Unit 21>

The drive unit 21 includes a direct current (DC) voltage source V1, a DC voltage source V2, a first switch section 3, a resistor R0, and a first resistor R1. The drive unit 21 further includes a terminal n1, a terminal N1, and a terminal N4.

The terminal n1 is connected to the terminal n2, a first switch section 3 and the charge extraction unit 22 (also referred to as a second switch section Tr).

The terminal N1 is connected to the terminal N2 and a node nd4. The node nd4 is the part that connects transistors 3n and 3p together in the first switch section 3. In other words, the node nd4 connects the source of the transistor 3n and the source of the transistor 3p together.

The terminal N4 is connected to the terminal N5 and a node nd2. The node nd2 is connected to a node nd1 and a ground point Gd. The node nd1 is the part that connects the negative pole of the DC voltage source V1 to the positive pole of the DC voltage source V2. The node nd1 is connected to the ground point Gd via the node nd2.

The DC voltage source V1 and the DC voltage source V2 are configured to supply voltages for turning on and off the semiconductor switch 10 (in particular the first transistor 1). The electrical continuity between the DC voltage source V1 and the gate 1G of the first transistor 1 is provided through the resistor R0 and the first switch section 3. The DC voltage source V1 is connected in series to the DC voltage source V2.

The DC voltage source V2 is configured to extract a charge (positive charge) from the second transistor 2 via the charge extraction unit 22. The DC voltage source V2 is also configured to extract a charge (positive charge) from the first transistor 1 via the first switch section 3 and the first resistor R1.

The absolute value of the voltage of the DC voltage source V2 can be specifically 5, 6, 7, 8, 9, 10, 11, 12, 13, 14, 15, 16, 17, 18, 19, or 20 volts, for example, and may be defined within a range between any two of the values illustrated here. The same applies to the DC voltage source V1. The power supply connected to the second switch section Tr of the charge extraction unit 22 may be an additional voltage source, which can be controlled independently of the DC voltage source V2.

The first switch section 3 includes the transistors 3n, 3p. The transistor 3n is an n-channel MOSFET and the transistor 3p is a p-channel type MOSFET. The gates (gate electrodes) of the transistors 3n and 3p are connected to a node nd3, while the sources (source electrodes) of the transistors 3n and 3p are connected to each other. The drain (drain electrode) of the transistor 3n is connected to the resistor R0, and the drain (drain electrode) of the transistor 3p is connected to the first resistor R1. The node nd3 connects the terminal n1, the gates of the transistors 3n and 3p, and the charge extraction unit 22 (i.e., a gate of the second switch section Tr).

<Charge Extraction Unit 22>

The charge extraction unit 22 is configured to make the potential of the base 2B of second transistor 2 lower than the potential of the emitter 2E of the second transistor 2 when the semiconductor switch 10 is turned off (turn-off) in response to an input signal. In other words, the charge extraction unit 22 is configured to extract (e.g., pull or remove) the charges of the second transistor 2 to the negative pole of the DC voltage source V2. The charges of the second transistor 2 implies the charges that is accumulated when the second transistor 2 is in the ON state.

The charge extraction unit 22 includes a second resistor R2 and the second switch section Tr.

One end of the second resistor R2 is connected to the second switch section Tr, while the other end is connected to the base 2B of the second transistor 2 via the terminal N3 and the second terminal G2.

The resistance of the second resistor R2 can be specifically 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 ohm(s), for example, and may be defined within a range between any two of the values illustrated here.

The second switch section Tr is configured as a field effect transistor (FET). In the first embodiment, the second switch section Tr is a p-channel MOSFET and has a gate (gate electrode), a drain (drain electrode) and a source (source electrode). The gate of the second switch section Tr is connected to the node nd3, a source of the second switch section Tr is connected to the second resistor R2, and a drain of the second switch section Tr is connected to the negative pole of the DC voltage source V2. The drive circuit 20 may include additional circuitry, e.g., amplification circuitry, to improve the switching performance of the semiconductor switch 10. It may also include a circuit that electrically isolates the drive circuit 20 from the circuit that generates the signal to be input to the terminal n2, e.g., a photocoupler.

In addition, instead of the resistor R0 and the first resistor R1, a single resistor for turn-on and turn-off can be placed between the node nd4 and terminal N1.

1-2. Operation Description 1-2-1. ON Operation of the Semiconductor Switch 10

Figure 2:
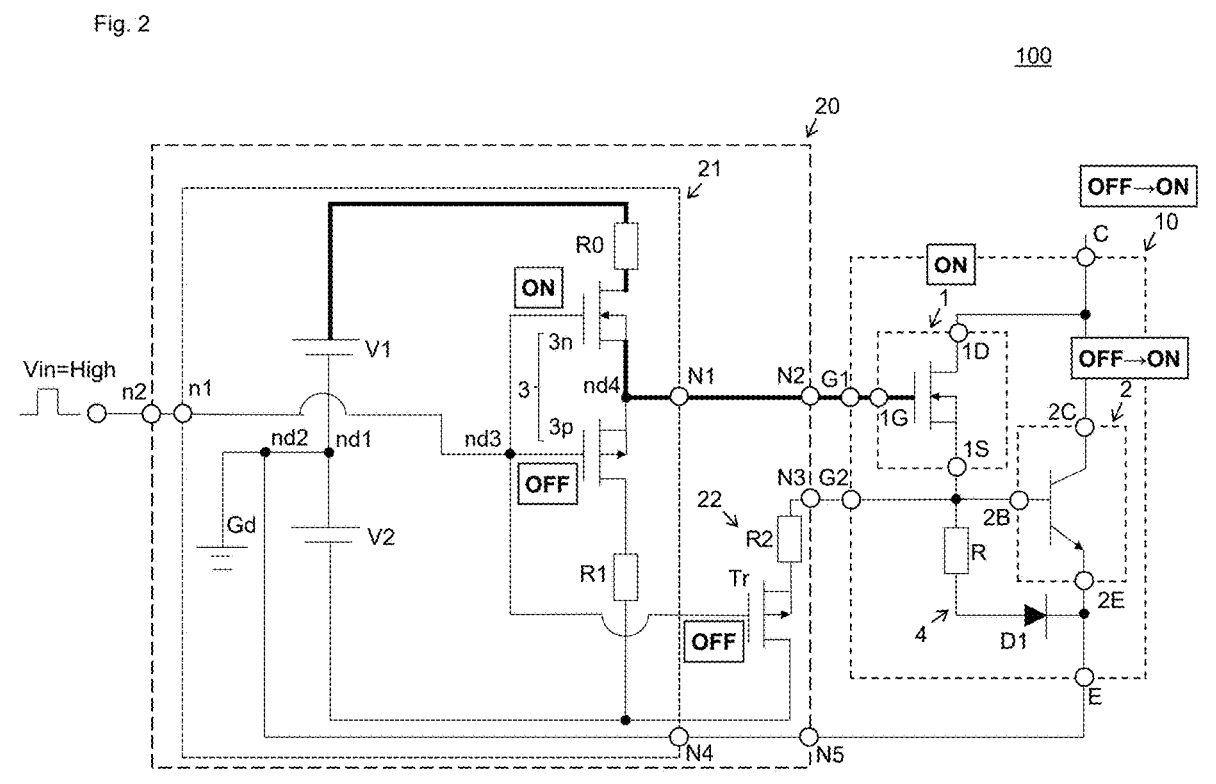

When a "High" level input signal is input to terminal n2 as shown in FIG. 2, the input signal causes only the transistor 3n of the first switch section 3 to turn ON among the first switch section 3 and the second switch section Tr. An electrical continuity is then established between the DC voltage source V1 and the gate 1G via the resistor R0, the transistor 3n, the node nd4, the terminal N1, the terminal N2, and the first terminal G1 as shown by the thick line in FIG. 2, and the voltage from the DC voltage source V1 is applied to the first terminal G1. As a result, first transistor 1 turns ON, thereby supplying current to base 2B of second transistor 2, second transistor 2 also turns ON, and thus semiconductor switch 10 turns ON.

The "High" level is an example of the first voltage. In the first embodiment, the "High" level can be the same voltage as the positive voltage of the DC voltage source V1, for example.

1-2-2. OFF Operation of the Semiconductor Switch 10 (Charge Extraction Operation)

When a "Low" level input signal is input to terminal n2 as shown in FIG. 3, the first switch section 3 and the second switch section Tr receive this input signal, then the transistor 3p of the first switch section 3 and the second switch section Tr turn ON.

The "Low" level is an example of the second voltage. In the first embodiment, the "Low" level can be the same voltage as the negative voltage of the DC voltage source V2, for example.

Since the transistor 3n in the first switch section 3 turns OFF, a voltage supply from the DC voltage source V1 to the gate 1G of the first transistor 1 stops, and the first transistor 1 begins to transition from the ON state to the OFF state. Here, charges are accumulated in the first transistor 1, and these charges acts to prevent a rapid transition to the OFF state. However, as shown by the bold line in FIG. 3, the gate 1G is electrically connected to the negative pole of the DC voltage source V2 via the first terminal G1, the terminal N2, the terminal N1, the node nd4, the transistor 3p, and the first resistor R1. As a result, the charges (positive charges) accumulated in the gate-drain capacitance and gate-source capacitance of the first transistor 1, which is a MOSFET, are quickly drawn out of the first transistor 1 and are extracted to the negative pole of the DC voltage source V2.

When the first transistor 1 is in the OFF state, current is no longer supplied to base 2B of the second transistor 2, so the second transistor 2 begins to transition from the ON state to the OFF state. Here, charges are also accumulated in the second transistor 2, and these charges prevent the second transistor 2 from quickly transitioning to the OFF state. However, as shown by the bold line in FIG. 3, the base 2B is electrically connected to the negative pole of the DC voltage source V2 via the second terminal G2, the terminal N3, the second resistor R2, and the second switch section Tr. As a result, the charges (positive charges) accumulated in the second transistor 2, which is a bipolar junction transistor, are quickly drawn out of the second transistor 2 and are extracted to the negative pole of the DC voltage source V2.

Thus, the charges are quickly drawn from the first and second transistors 1, 2, and the first and second transistors 1, 2 are quickly switched from the ON state to the OFF state, the turn-off operation of the semiconductor switch 10 is accelerated, and the turn-off delay time and the loss of the semiconductor switch 10 can be effectively reduced.

In the first embodiment, the branch 4 includes the diode D1. Thus, the power loss in the second resistor R2 caused by a DC current flowing in the circuit consisting of the branch 4, the second terminal G2, the terminal N3, the second resistor R2, the second switch section Tr, the DC voltage source V2, the nodes nd1 and nd2, and the fourth terminal E can be avoided during the entire period of charge extraction operation (i.e., OFF operation). In other words, the diode D1 has the effect of reducing the power loss in the second resistor R2 during turn-off operation.

Figure 5:
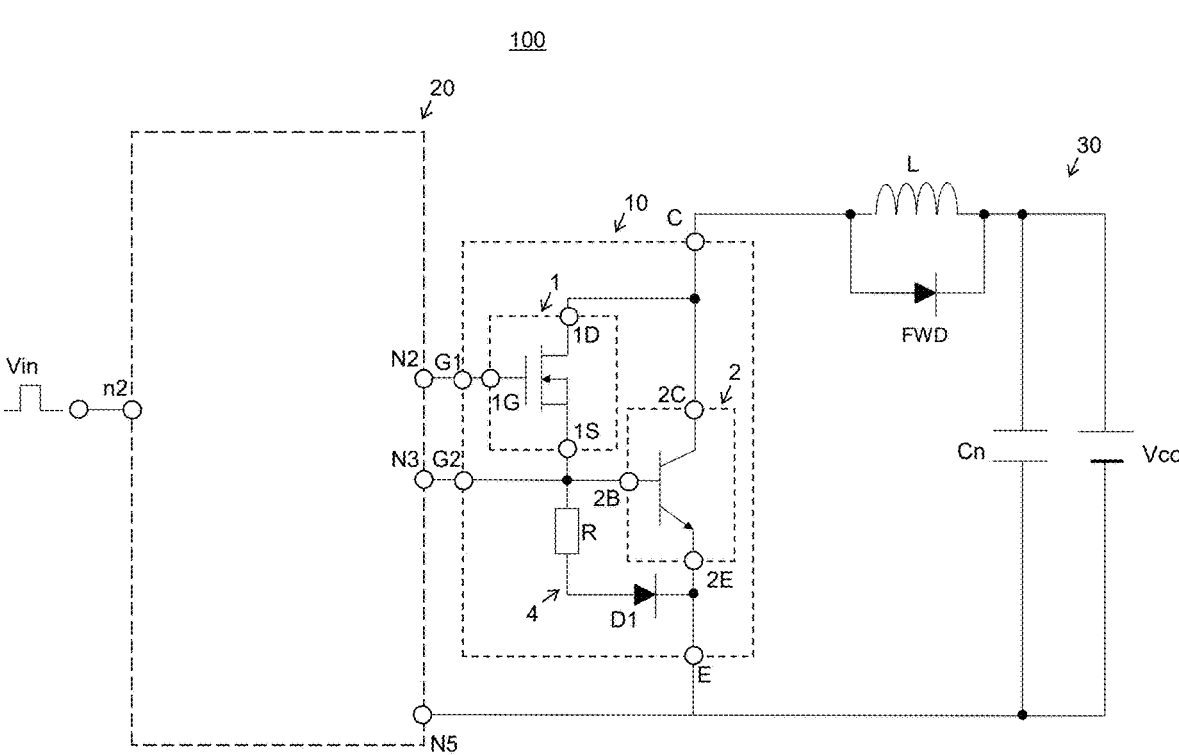
FIG. 5 is a diagram of the measurement circuit used to measure the switching characteristics of the semiconductor switch 10 shown in FIG. 1.

1-3. Characteristic Evaluation of the Semiconductor Circuit 100 according to the First Embodiment 1-3-1. Evaluation Circuits for Various Characteristics Referring to FIG. 5, a measurement circuit 30 for evaluating the performance of the semiconductor circuit 100 is described. The measurement circuit 30 shown in FIG. 5 includes an inductor L and a diode FWD connected in parallel with each other, and a capacitor Cn and a power supply Vcc connected in parallel with each other.

The measurement circuit 30 measures switching performance using the double-pulse method. The double-pulse method is well known as a common method for measuring the switching performance of power devices. In the first embodiment, the inductance of the inductor L is 1 millihenry (mH), the voltage of the power supply Vcc is 300 volts (V), and the load current is 6 amperes (A).

1-3-2. Description of Various Characteristics

Figure 6:
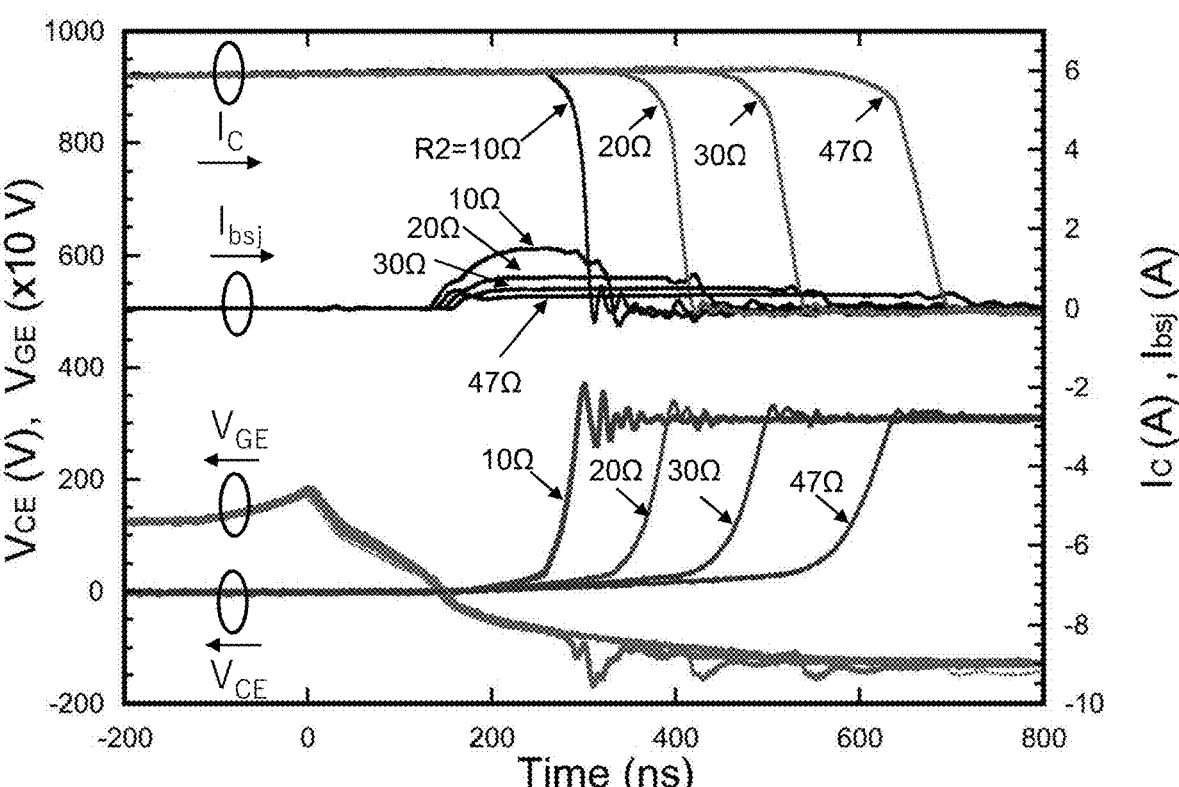
FIG. 6 shows graphs to illustrate the turn-off characteristics of a collector current $I_c$, etc. at a third terminal C of the semiconductor switch 10 shown in FIG. 1.
Figure 7:
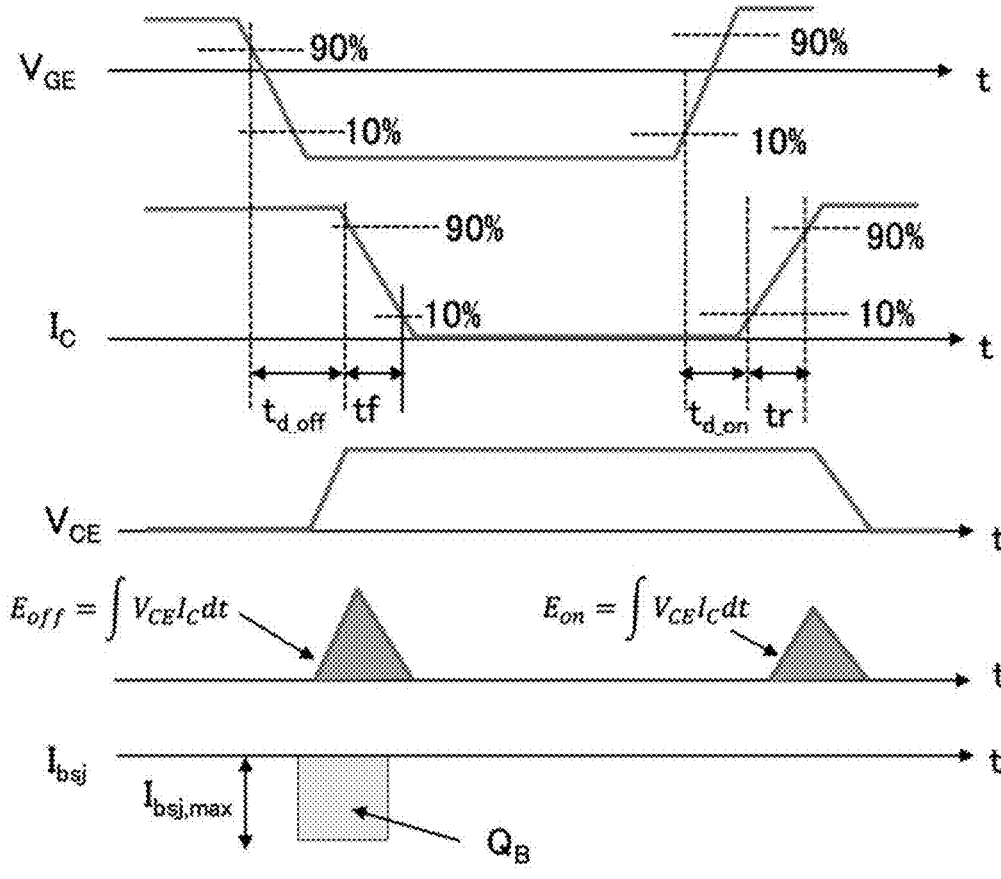
FIG. 7 illustrates the definition of the characteristics (the collector current $I_c$, etc.) of the various parts of the semiconductor switch 10 during the turn-off and turn-on operations.

The characteristics shown in FIGS. 6 and 7 are explained.

(1) Voltage VGE is the voltage between the first terminal G1 and the fourth terminal E (i.e., between the gate 1G and the emitter 2E) of the semiconductor switch 10.

(2) Collector current $I_c$ is the current flowing into the third terminal C. The collector current $I_c$ is the principal current of the semiconductor switch 10.

(3) Voltage $V_{CE}$ is the voltage between the third terminal C and the fourth terminal E (i.e., between the collector 2C and emitter 2E).

(4) Current $I_{bsj}$ is the current flowing through the charge extraction unit 22 and the base 2B.

(5) Turn-off delay time $t_{d\_off}$ is the duration from when the voltage VGE drops to 90% to when the collector current $I_c$ drops to 90%. Turn-on delay time $t_{d\_on}$ is the duration from when the voltage VGE rises to 10% to when the collector current $I_c$ rises to 10%.

(6) Fall time tf is the duration from when the collector current $I_c$ drops to 90% to when the collector current $I_c$ drops to 10%. Rise time tr is the duration from when the collector current $I_c$ rises to 10% to when the collector current $I_c$ rises to 90%.

(7) Loss $E_{off}$ at turn-off can be obtained by integrating the product of the collector current $I_c$ and voltage $V_{CE}$ over time. Loss Eon at turn-on can Similarly be obtained by integrating the product of the collector current $I_c$ and voltage $V_{CE}$ over time.

(8) Current $I_{bsj}$ at turn-off is the current flowing from the base 2B of the second transistor 2 to the negative pole of the DC voltage source V2 through the second resistor R2 and the second switch section Tr at the turn-off of the semiconductor switch 10.

(9) Maximum value $I_{bsj}$,max is the maximum value of the current $I_{bsj}$.

(10) Charge QB is the charge (i.e., charge amount) corresponding to the current $I_{bsj}$ and is obtained by integrating the current $I_{bsj}$ at turn-off over time.

The following characteristics (11) and (12) are not shown in FIGS. 6 and 7 but will be used in later sections.

(11) Loss $E_{r2}$ is the loss generated in the second resistor R2 when the current $I_{bsj}$ flows in the second resistor R2 during the turn-off.

(12) di/dt is the time derivative of the collector current $I_c$. dV/dt is the time derivative of the voltage $V_{CE}$. di/dt and dV/dt are performance parameters related to radiated noise and self-destruction during switching of semiconductor devices.

1-3-3. Dependence of Various Characteristics on the Second Resistor R2

FIG. 5 and FIGS. 8A through 8D illustrate how the various characteristics change as the resistance of the second resistor R2 is varied.

The conditions are as follows.

The resistor R0 and the first resistor R1 are both 75 ohms (Ω), and the shunt resistor R is 10 ohms (Ω).

The DC voltage source V1 and the DC voltage source V2 are both 15 volts (V). That is, +15 volts (V) at the positive pole side of the DC voltage source V1 and −15 volts (V) at the negative pole side of the DC voltage source V2.

Figures 8A, 8B, 8C, 8D:
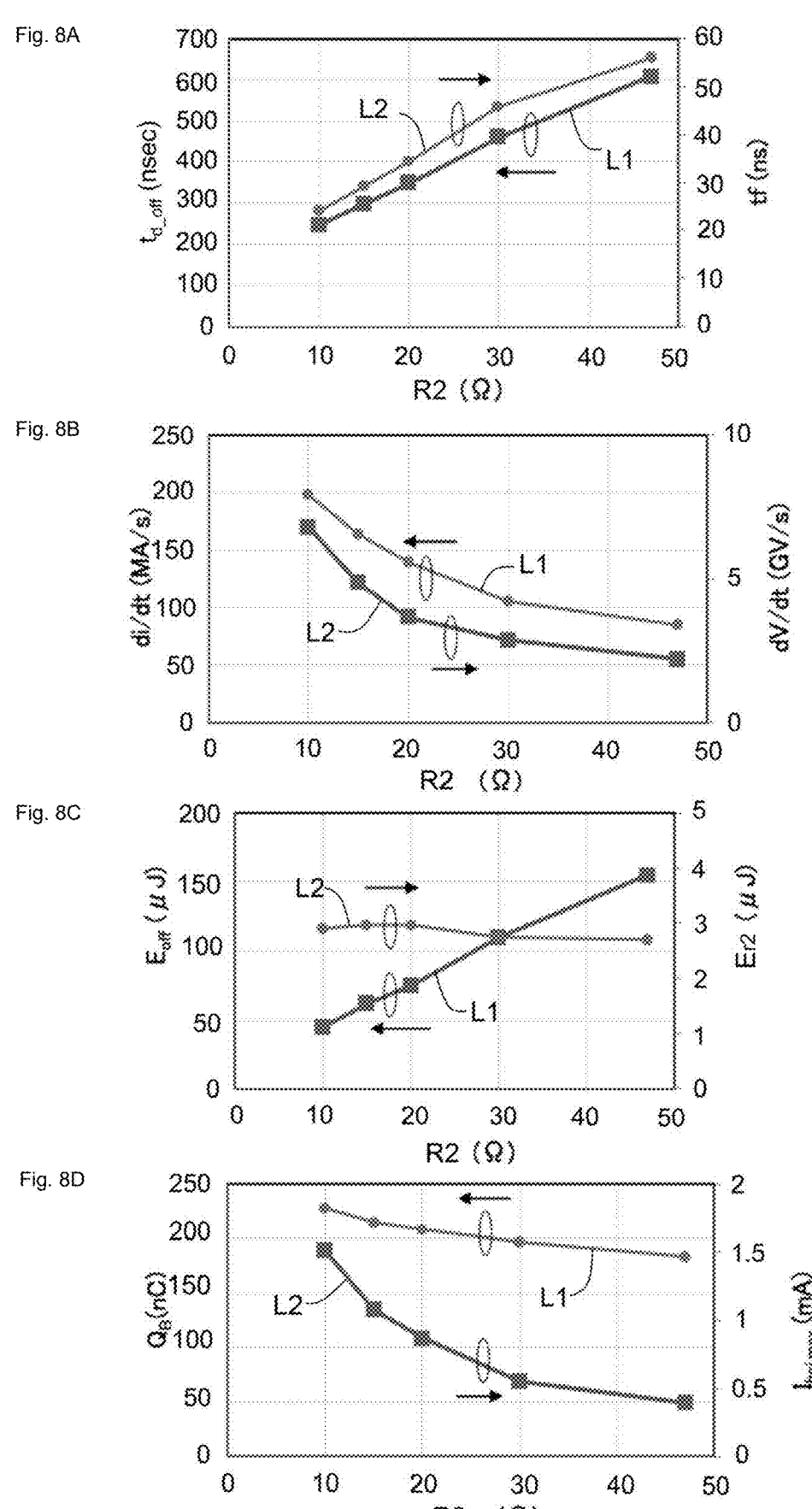
FIGS. 8A through 8D show graphs illustrating the dependence of various characteristics of the semiconductor switch 10 according to the first embodiment on the second resistor R2 during turn-off operation.
Figure 9A:
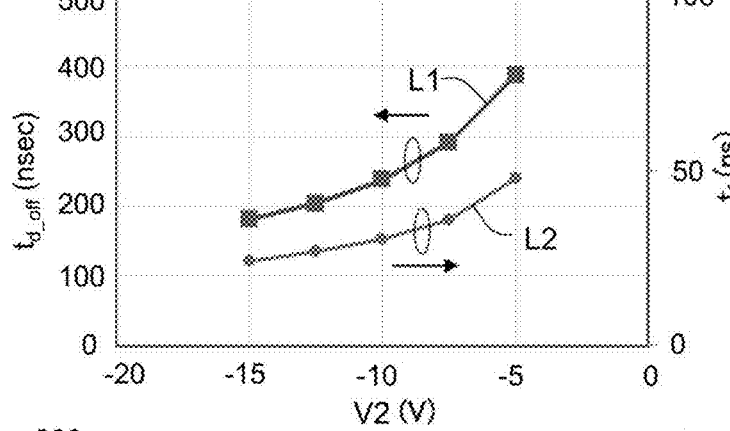
FIGS. 9A through 9D show graphs illustrating the dependence of various characteristics of the semiconductor switch 10 according to the first embodiment on the DC voltage source V2 during turn-off operation. The various characteristics exemplified in FIGS. 9A through 9D are the same as those exemplified in FIGS. 8A through 8D.
Figure 9B:
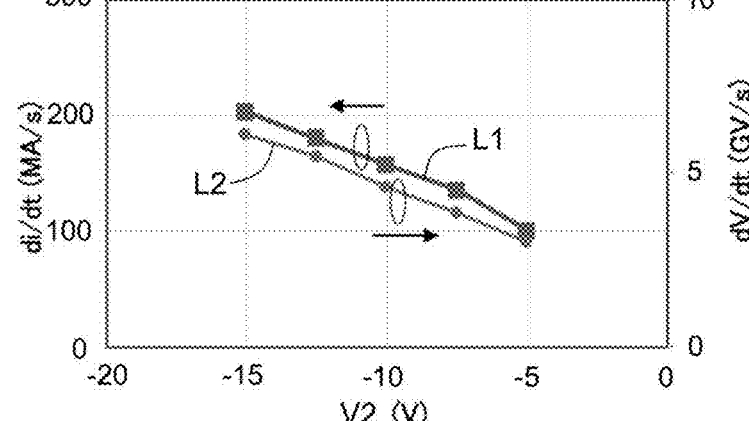
Figure 9C:
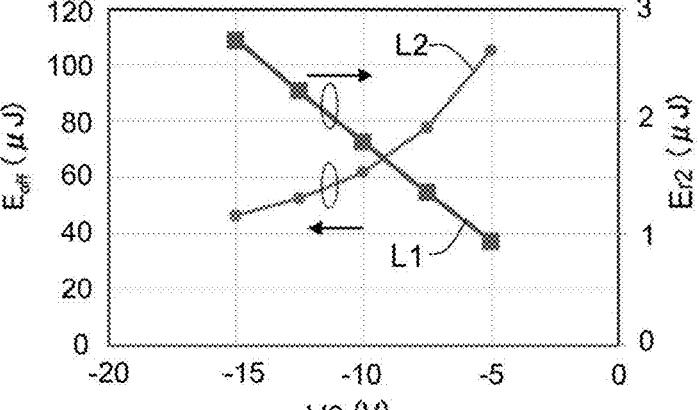
Figure 9D:
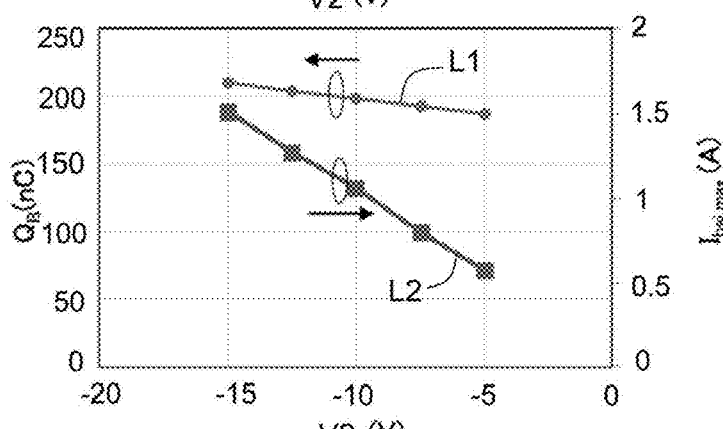
Figure 10A:
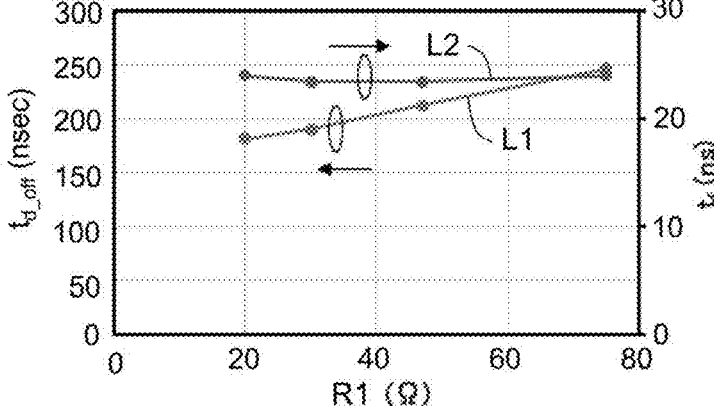
FIGS. 10A through 10D show graphs illustrating the dependence of various characteristics of the semiconductor switch 10 according to the first embodiment on a first resistor R1 during turn-off operation. The various characteristics exemplified in FIGS. 10A through 10D are the same as those exemplified in FIGS. 8A through 8D.
Figure 10B:
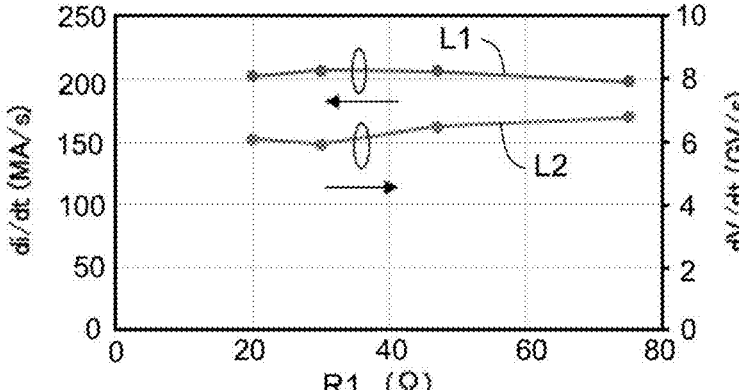
Figure 10C:
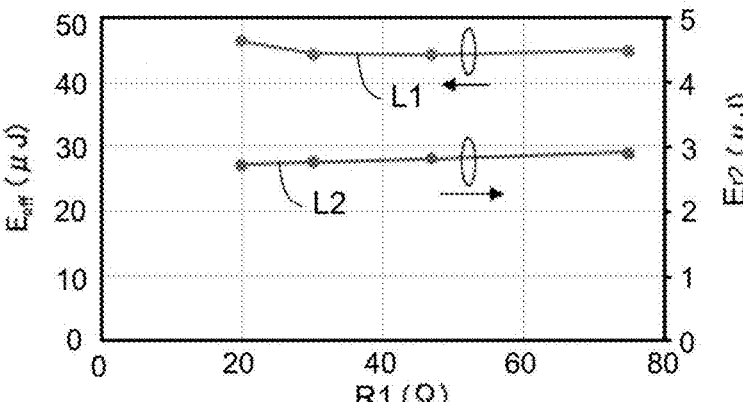
Figure 10D:
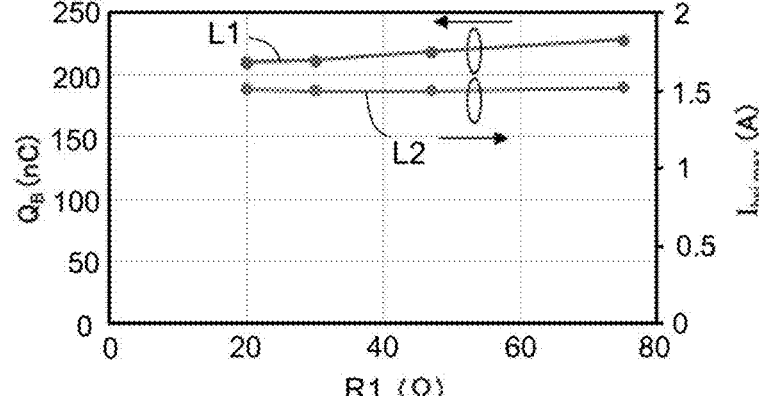

As shown in FIG. 8A, the decrease in the second resistor R2 results in a decrease in the delay time $t_{d\_off}$ and the fall time tf at turn-off of the semiconductor switch 10. For example, if the second resistor is 10 ohms (Ω), the delay time $t_{d\_off}$ is approximately 247 nanoseconds (ns) as shown in L1 of FIG. 8A, and the fall time tf is approximately 24 nanoseconds (ns) as shown in L2 of FIG. 8A. In other words, they are about half that of the 47 ohms (Ω) case.

FIG. 8D shows the results of the dependence of the maximum value $I_{bsj}$,max, which is the maximum value of the current $I_{bsj}$, on the second resistor R2. The reason why the turn-off delay time $t_{d\_off}$ and the fall time tf decrease with the decrease in the second resistor R2, as shown in FIG. 8A, is that the decrease in the second resistor R2 increases the $I_{bsj,max}$ which is the maximum value of the current $I_{bsj}$, and this allows the charge stored in the second transistor 2 to be rapidly drawn off during turn-on. As a result, the time spent in turn-off of the semiconductor switch 10 is reduced.

By the same effect, the loss $E_{off}$ at turn-off is also reduced by the decrease in the second resistor R2, as shown in FIG. 8C. Also shown in FIG. 8C is the loss $E_{r2}$, which is negligible because it is less than one-tenth of the loss $E_{off}$.

FIG. 8B shows the results of di/dt and dV/dt measurements. The results shown in FIG. 8B indicate that di/dt and dV/dt can be controlled by adjusting the value of the second resistor R2. This will be useful in adjusting the trade-off between the amount of radiated noise, self-destruction resistance and the like, and the switching losses when the semiconductor switch 10 is used in a power converter circuit.

1-3-4. Dependence of Various Characteristics on the DC voltage source V2

FIGS. 9A through 9D show how the various characteristics change as the absolute value of the DC voltage source V2 is varied. The results shown in FIGS. 9A through 9D indicate that increasing the absolute value of the DC voltage source V2 has the same effect on improving turn-off performance as decreasing the second resistor R2 shown in FIGS. 8A through 8D.

The conditions are as follows.

the resistor R0 is 75 ohms (Ω), the first resistor R1 is 20 ohms (Ω), the second resistor R2 is 10 ohms (Ω), and the shunt resistor R is 10 ohms (Ω).

The DC voltage source V1 is 15 volts (V).

1-3-5. Dependence of Various Characteristics on the First Resistor R1

FIGS. 10A through 10D show how the various characteristics change as the resistance of first resistor R1 is varied.

The results shown in FIGS. 10A through 10D indicate that the decrease in the first resistor R1 decreases the delay time $t_{d\_off}$ of the semiconductor switch 10, but has no noticeable effect on the other characteristics.

Based on the results shown in FIGS. 10A through 10D and FIG. 6, it is possible to decrease the delay time $t_{d\_off}$ while keeping di/dt and dV/dt fixed by decreasing the first resistor R1 in the semiconductor circuit 100 according to the first embodiment.

The conditions are as follows.

The resistor R0 is 75 ohms (Ω), the second resistor R2 is 10 ohms (Ω), and the shunt resistor R is 10 ohms (Ω).

The DC voltage source V1 and the DC voltage source V2 are both 15 volts (V). That is, +15 volts (V) at the positive pole side of the DC voltage source V1 and −15 volts (V) at the negative pole side of the DC voltage source V2.

1-4. Operation and Effect of the First Embodiment

The semiconductor switch 10 according to the first embodiment has the second transistor 2, which is a superjunction bipolar junction transistor, Darlington-connected to the first transistor 1, which is a field effect transistor. And in this Darlington connection, the first transistor 1 is located in the front stage. This allows the semiconductor switch 10 to control the second transistor (superjunction bipolar junction transistor) via the first transistor, which can be voltage-controlled, for enhanced convenience.

The semiconductor switch 10 according to the first embodiment, to the extent that it has the Darlington-connected first transistor 1, may lose its low on-resistance performance compared to a switch with a superjunction bipolar junction transistor alone. Even so, the effect of the superjunction structure allows the semiconductor switch 10 to achieve low on-resistance compared to competing switches such as IGBTs and MOSFETs with superjunction structures as described below.

The semiconductor switch 10 is voltage-controllable, while it has the second transistor 2, which is a superjunction bipolar junction transistor.

Superjunction bipolar junction transistors have a relatively large amount of charge accumulated internally when turned on, so the accumulated charge affects the turn-off operation and tends to increase the delay time and the turn-off loss. For example, in a semiconductor switch with only a superjunction bipolar junction transistor, the effect of the accumulated charge when the said transistor is turned on is significant, and the delay time for turn-off may be, for example, 1 usec or longer.

However, since the semiconductor circuit 100 has the charge extraction unit 22, the delay time can be reduced and losses can also be reduced even if the semiconductor switch 10 contains a bipolar junction transistor. In other words, the charge accumulated in the second transistor 2 when the second transistor 2 is turned on is quickly drawn out through the charge extraction unit 22 and extracted to the negative pole of the DC voltage source V2 when turned off, thereby reducing the delay time and losses of the semiconductor switch 10.

As shown in FIG. 6, by decreasing the resistance of the second resistor R2, the charge extraction unit 22 can quickly extract the accumulated charge in the base 2B of the second transistor 2, and a reduction in the delay time and loss at turn-off can be expected.

Power converter circuits using power semiconductors are applied in various fields such as home appliances, HEV/EV, electric railway and various power supplies. In the future, demand for these products is expected to increase due to further advancement of lifestyles and promotion of energy conservation. The demand for electric power is expected to increase accordingly, and there is an urgent need to achieve high-speed switching and low-loss performance of power semiconductors used in devices such as power converters, for example. In recent years, development and commercialization of low-loss power semiconductor switching devices using wide bandgap semiconductor materials such as SiC and GaN has been progressing, while development of inexpensive, low-loss power switching devices using conventional Si has been advancing. One such device is the transistor with the superjunction structure described above.

The first embodiment is equipped with a bipolar junction transistor with this superjunction structure, which confers the advantages of high blocking voltage, low on-resistance, and steep turn-off characteristics, while the Darlington connection of the first transistor 1 allows voltage-control.

In addition, the semiconductor circuit 100 can reduce the delay time and losses of the semiconductor switch 10. Therefore, for example, in case that the semiconductor circuit 100 is equipped in a device such as a power converter, the efficiency of the power converter can be improved and the size of the heat sink can be reduced because heat generation is reduced, which can be expected to have the effect of downsizing the device. Further, semiconductor switches in power converter circuits can be operated at high frequencies, and filters in power converter circuits can be made smaller.

For example, IGBTs have a poor collector current $I_c$ fall characteristic at turn-off, and their turn-off characteristic is not steep. The voltages required for power semiconductors are high, and the switching frequency in e.g. inverter circuits is high, so the amount of heat generated by the switching elements tends to be quite large. In contrast, the semiconductor circuit 100 according to the first embodiment can make the fall of the collector current $I_c$ steep and is configured to easily reduce the amount of heat generated.

2. Second Embodiment 2-1. Configuration Description

Figure 11:
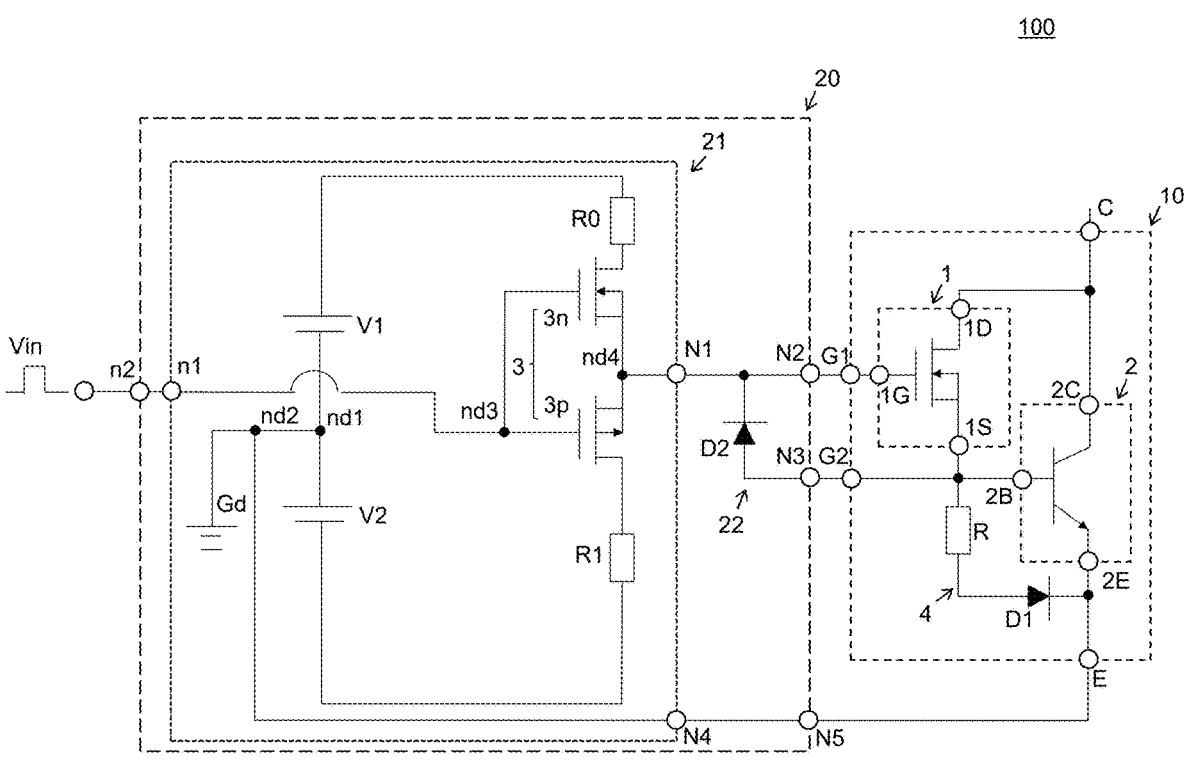
FIG. 11 is a circuit configuration diagram of the semiconductor circuit 100 including the semiconductor switch 10 according to the second embodiment.

In the second embodiment, the parts that differ from the first embodiment are explained, and the explanation of the common parts is omitted. In the second embodiment, the configuration of the charge extraction unit 22 is different from that of the first embodiment. As shown in FIG. 11, in the second embodiment, the charge extraction unit 22 includes an extraction diode D2. An anode of the extraction diode D2 is connected to the base 2B of the second transistor 2. A cathode of the extraction diode D2 is connected to the gate 1G of the first transistor 1. Other configurations are common to the first embodiment.

2-2. Operation Description

The extraction path from the first transistor 1 to the DC voltage source V2 is the same as in the first embodiment. Note that the second transistor 2 is not directly transitioned from the Off state to the On state by the DC voltage source V1 because the extraction diode D2 is reverse biased when the transistor 3n is on. In other words, the second transistor 2 turns on as a result of the first transistor 1 turning on and current being supplied to the base 2B via the third terminal C and the first transistor 1. As such, since the extraction diode D2 is reverse biased, the supply of excess charge to the second transistor 2 can be suppressed and excessive driving of the semiconductor switch 10 can be avoided.

The extraction path from the second transistor 2 to the DC voltage source V2 is different from the first embodiment. The accumulated charge in the second transistor 2 is extracted to the negative pole of the DC voltage source V2 via the base 2B, the second terminal G2, the terminal N3, the extraction diode D2, the terminal N1, the node nd4, the transistor 3p and the first resistor R1. That is, the charge (positive charge) accumulated in the second transistor 2, which is a bipolar junction transistor, is quickly drawn out from the second transistor 2 as in the first embodiment, and extracted to in the negative pole of the DC voltage source V2.

2-3. Performance Evaluation of the Semiconductor Circuit 100 according to the Second Embodiment The measurement circuit 30 used is the same as in FIG. 5 described in the first embodiment. The conditions (the inductor L, the power supply Vcc, and the load current values) are also the same.

2-3-1. Dependence of Various Characteristics on the First Resistor R1 Referring to FIGS. 12A through 12D, it will be explained how the various characteristics change as the resistance of first resistor R1 is varied.

Figure 12A:
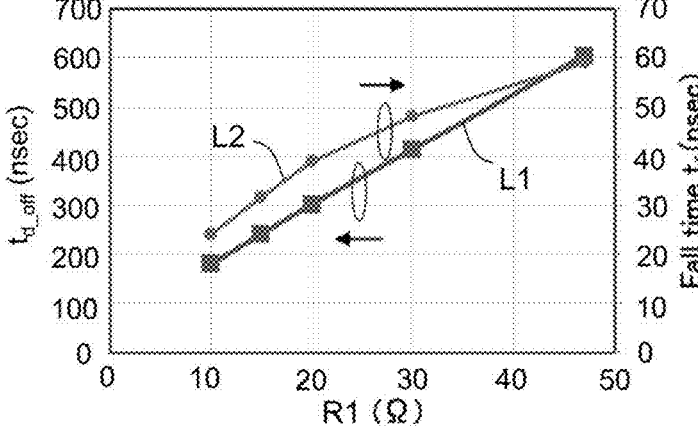
FIGS. 12A through 12D show graphs illustrating the dependence of various characteristics of the semiconductor switch 10 according to the second embodiment on the first resistor R1 during turn-off operation.
Figure 12B:
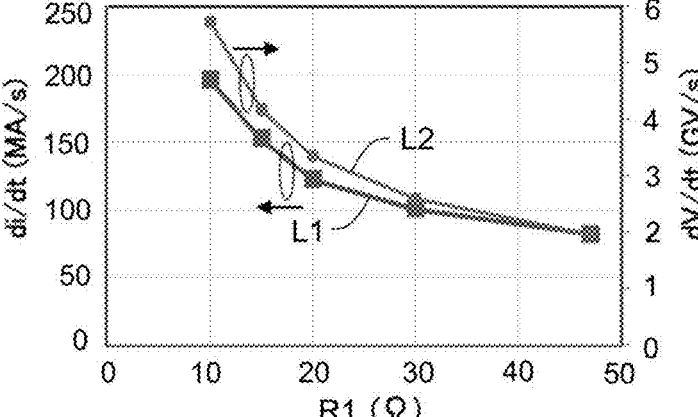
Figure 12C:
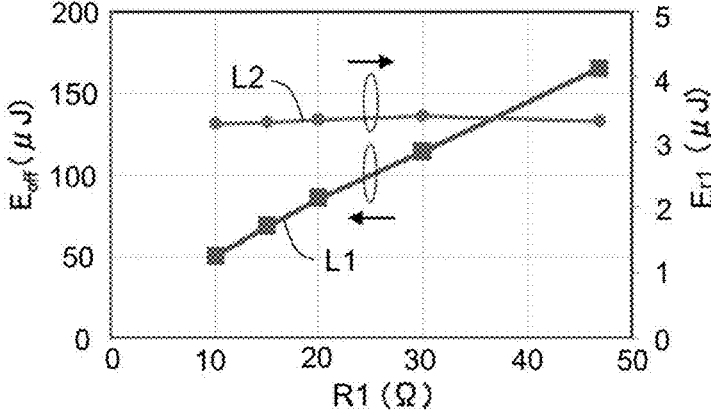
Figure 12D:
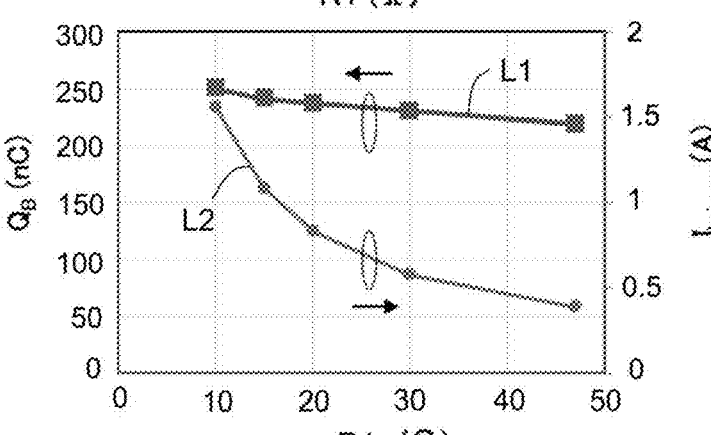

The results in FIG. 12A show that the decrease in the first resistor R1 reduces the delay time $t_{d\_off}$ and the fall time tf. This is because decreasing the first resistor R1 increases the maximum value $I_{bsj,max}$ of the current $I_{bsj}$ to draw out the accumulated charge in the On state of the second transistor 2, as shown in FIG. 12D, and reduces the time to draw out the accumulated charge. This is a similar effect to reducing the second resistor R2 in the first embodiment. The resulting reduction in the first resistor R1 effectively reduces the loss $E_{off}$ at turn-off of the semiconductor switch 10, as shown in FIG. 12C.

The conditions are as follows.

The resistor R0 is 75 ohms (Ω) and the shunt resistor R is 10 ohms (Ω).

The DC voltage source V1 and the DC voltage source V2 are both 15 volts (V).

In light of the results in FIGS. 12A through 12D, the resistance of the first resistor R1 can be specifically 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 ohm(s), for example, and may be defined within a range between any two of the values illustrated here.

2-3-2. Dependence of Various Characteristics on the DC voltage source V2

Referring to FIGS. 13A through 13D, it will be explained how the various characteristics change as the absolute value of the DC voltage source V2 is varied.

The results in FIGS. 13A through 13D show that increasing the absolute value of the DC voltage source V2 improves various characteristics of the turn-off operation, such as the delay time $t_{d\_off}$, the fall time tf, and the loss $E_{off}$.

Figure 13A:
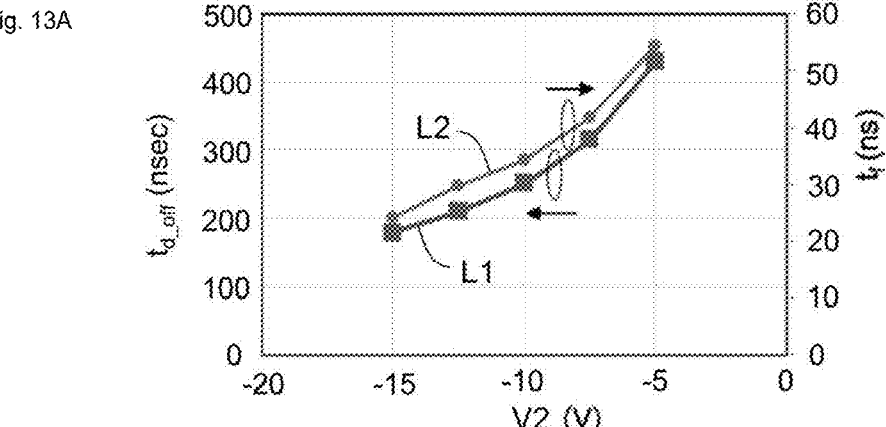
FIGS. 13A through 13D show graphs illustrating the dependence of various characteristics of the semiconductor switch 10 according to the second embodiment on the DC voltage source V2 during turn-off operation. The various characteristics exemplified in FIGS. 13A through 13D are the same as those exemplified in FIGS. 12A through 12D.
Figure 13B:
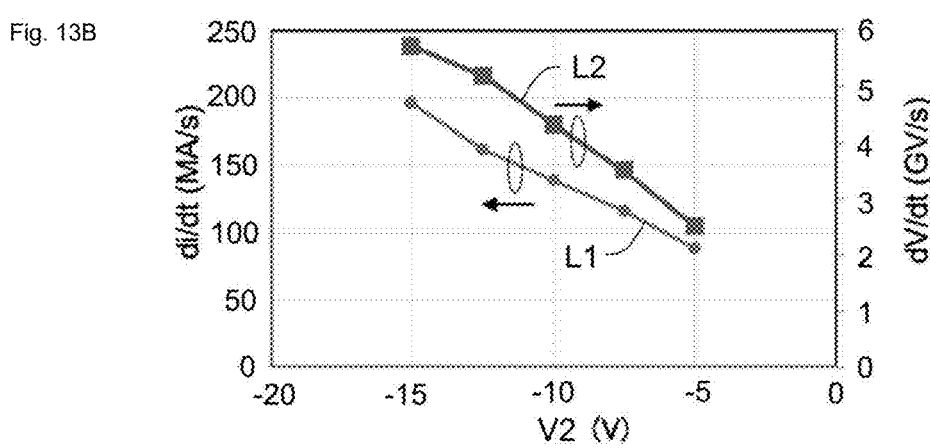
Figure 13C:
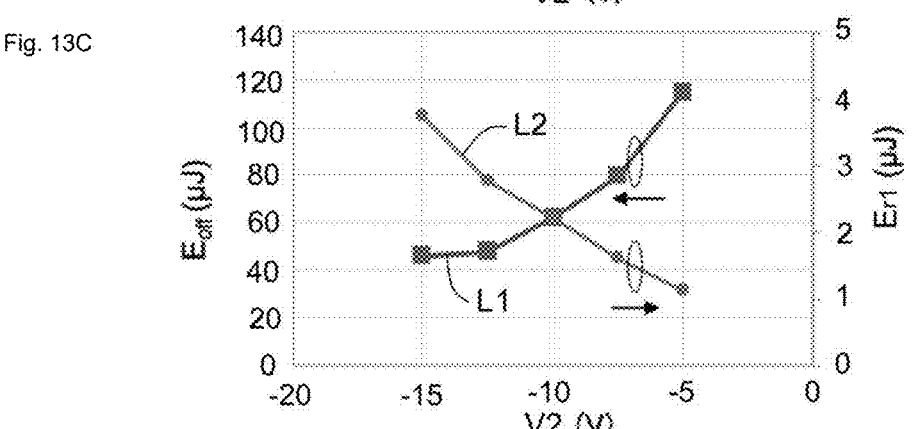
Figure 13D:
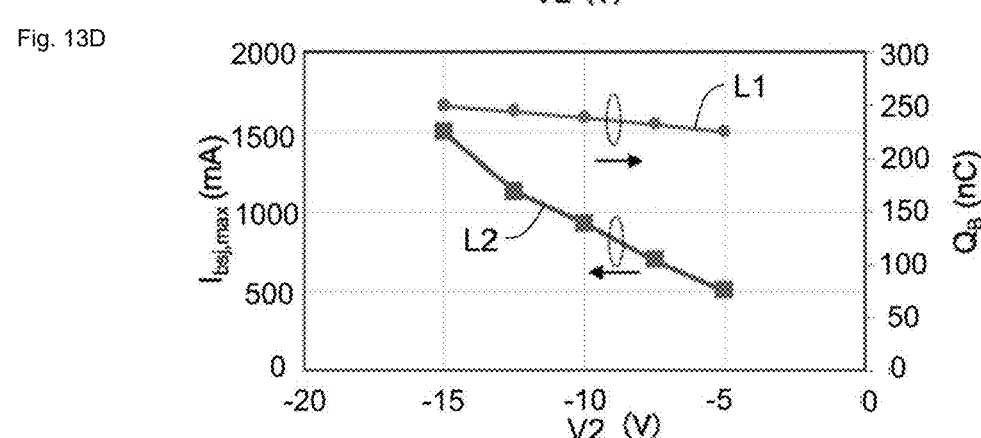

This is because, similarly to decreasing the first resistor R1, increasing the absolute value of the DC voltage source V2 makes it possible to increase the current that draws out the accumulated charge in the second transistor 2. The loss $E_{r1}$ in the first resistor R1 that occurs in that case is less than 10% of the loss $E_{off}$ if the voltage of the negative pole of the DC voltage source V2 is up to −15 volts (V) as shown in FIG. 13C, which is sufficiently small. In other words, how much the absolute value of the DC voltage source V2 can be increased depends on how much the power loss $E_{r1}$ in the first resistor R1 can be tolerated and how much the performance of the DC voltage source V2 in the drive circuit 20 can be raised.

The loss $E_{r1}$ described above is the loss that occurs at the first resistor R1 when the current $I_{bsj}$ flows through the first resistor R1 during turn-off. In the second embodiment, the current $I_{bsj}$ is due to both the charge accumulated in the first and second transistors 1, 2, since the charge of both the first and second transistors 1, 2 passes through the first resistor R1.

The conditions are as follows.

The resistor R0 is 390 ohms (Ω), the first resistor R1 is 10 ohms (Ω), and the shunt resistor R is 10 ohms (Ω).

The DC voltage source V1 is 15 vols (V).

In light of the results in FIGS. 13A through 13D, the absolute value of the DC voltage source V2 can be specifically 5, 6, 7, 8, 9, 10, 11, 12, 13, 14, or 15 volts (V), for example, and may be defined within a range between any two of the values illustrated here. The same applies to the DC voltage source V1.

2-3-2. Comparison with Si-IGBTs

Figure 14:
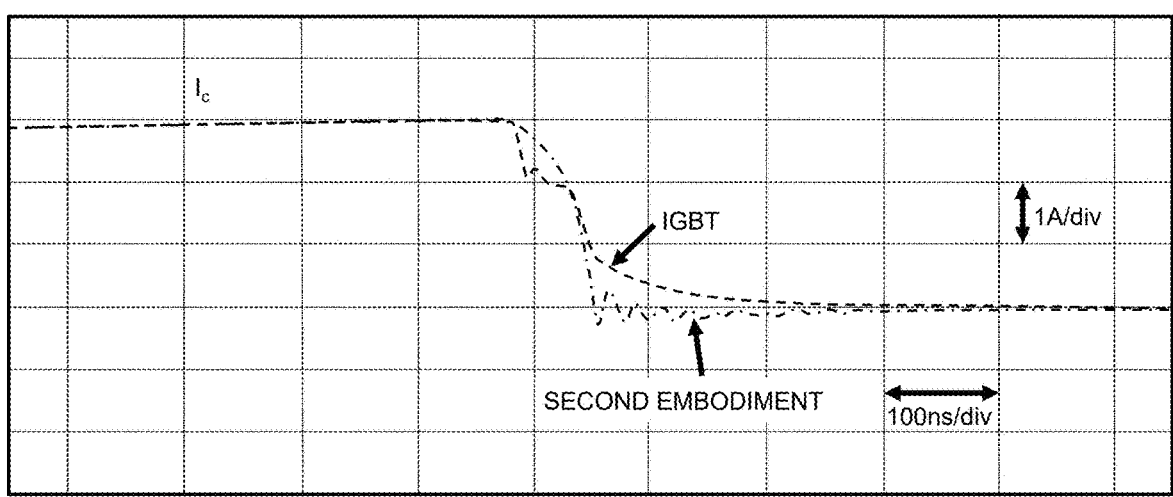
FIG. 14 shows graphs illustrating the waveform of the characteristic (i.e., the collector current $I_c$) of the semiconductor switch 10 according to the second embodiment during turn-off operation and the waveform of the same characteristic of the Si-IGBT as a comparative example.

Referring to FIG. 14, the case in which a superjunction bipolar junction transistor is employed in the second transistor 2 of the semiconductor circuit 100 (the configuration according to the second embodiment) and the case in which a Si-IGBT is employed are compared.

As shown in FIG. 14, the Si-IGBTs case exhibits a smooth fall of collector current $I_c$ (poor collector current $I_c$ fall characteristic), which may increase losses and associated heat generation. In contrast, in the configuration of the second embodiment, the fall in the collector current $I_c$ is steep, and losses and associated heat generation can be effectively reduced.

The conditions in the configuration employing Si-IGBTs are as follows.

The resistor R0 is 30 ohms (Ω) and the first resistor R1 is 30 ohms (Ω).

The DC voltage source V1 and the DC voltage source V2 are both 15 volts (V).

The conditions in the configuration employing a superjunction bipolar junction transistor are as follows.

The resistor R0 is 100 ohms (Ω), the first resistor R1 is 10 ohms (Ω), and the shunt resistor R is 10 ohms (Ω).

The DC voltage source V1 and the DC voltage source V2 are both 10 volts (V).

2-4. Operation and Effect of the Second Embodiment

The semiconductor switch 10 and the semiconductor circuit 100 according to the second embodiment have the same effects as those of the first embodiment.

3. Other Embodiments

In the embodiments, it is explained that the anode of the diode D1 is to be connected to the shunt resistor R. However, this is not the only case. The diode D1 and the shunt resistor R can be interchanged with each other. In other words, the cathode of the diode D1 may be connected to the shunt resistor R, and the shunt resistor R may be connected to the emitter 2E of the second transistor 2.

In the first and second embodiments, it is explained that the first transistor 1 is an n-channel MOSFET and the second transistor is a superjunction bipolar junction transistor, but are not limited to thereto.

The first transistor 1 may be a superjunction MOSFET, a Junction Field Effect Transistor (JFET), a Metal-Semiconductor Field Effect Transistor (MESFET), or a High Electron Mobility Transistor (HEMT), and the second transistor 2 may be a n-p-n type junction transistor, or a heterojunction bipolar transistor.

REFERENCE SIGNS LIST

1: first transistor, 1D: drain, 1G: gate, 1S: source, 1S: source, 2: second transistor, 2B: base, 2C: collector, 2E: emitter, 3: first switch section, 3*n*: transistor, 3*p*: transistor, 4: branch, D1: diode, R: shunt resistor, 10: semiconductor switch, 20: drive circuit, 21: drive unit, 22: charge extraction unit, R2: second resistor, Tr: second switch section, D2: extraction diode, 30: measurement circuit, 50: insulating layer, 51: base electrode layer, 52: collector electrode layer, 53: emitter electrode layer, 54*n*: n-type contact region, 54*p*: p-type contact region, 55: n-type semiconductor layer, 56: p-type base layer, 56*p*: p-type sinker, 57: superjunction layer, 57*n*: n-type region, 57*p*: p-type region, 58: n-type semiconductor layer, 100: semiconductor circuit, G1: first terminal, G2: second terminal, C: third terminal, E: fourth terminal, Gd: ground point, N1: terminal, N2: terminal, N3: terminal, N4: terminal, N5: terminal, R0: resistor, R1: first resistor, V1: DC voltage source, V2: DC voltage source, n1: terminal, n2: terminal, nd1: node nd2: node, nd3: node, nd4: node

The invention claimed is:

1. A semiconductor circuit comprising:
a semiconductor switch; and
a drive circuit, wherein
the semiconductor switch includes a first transistor and a second transistor, the first transistor being a field-effect transistor, the second transistor being a superjunction bipolar junction transistor,
the drive circuit includes a signal input section which receives an input signal and a charge extraction unit,
the first transistor and the second transistor are Darlington-connected such that the first transistor is located in the front stage, and
the charge extraction unit is configured to make a potential of a base of the second transistor lower than a potential of an emitter of the second transistor when the semiconductor switch is turned off in response to the input signal.

2. The semiconductor circuit of claim 1, wherein
the drive circuit further includes:
a first switch section connected to a gate of the first transistor; and
a direct current voltage source connected to the first switch section,
the signal input section is connected to the first switch section so that the input signal is input to the first switch section,
the first switch section is configured to invert the polarity of the voltage supplied from the direct current voltage source to the semiconductor switch, depending on whether the input signal is a first voltage or a second voltage, and
the charge extraction unit is connected to the base of the second transistor,
when the input signal is the first voltage, a predetermined voltage from the direct current voltage source is applied to the gate of the first transistor to turn on the semiconductor switch, and
in the transition of the input signal from the first voltage to the second voltage, charges in the gate of the first transistor are extracted to the direct current voltage source via the first switch section to turn off the semiconductor switch, and charges in the base of the second transistor are extracted to the negative pole of the direct current voltage source.

3. The semiconductor circuit of claim 2, wherein
the drive circuit further includes a first resistor connected to the direct current voltage source and the first switch section,
the charge extraction unit includes:
a second switch section connected to the direct current voltage source; and
a second resistor connected to the base of the second transistor and the second switch section,
the signal input section is connected to the second switch section so that the input signal is input to the second switch section, and
in the transition of the input signal from the first voltage to the second voltage, charges in the gate of the first transistor are extracted to the direct current voltage source via the first switch section and the first resistor, and the second switch section is turned on and charges in the base of the second transistor are extracted to the direct current voltage source via the second resistor and the second switch section.

4. The semiconductor circuit of claim 2, wherein
the drive circuit further includes a first resistor connected to the direct current voltage source and the first switch section,
the charge extraction unit includes an extraction diode whose anode is connected to the base of the second transistor and whose cathode is connected to the gate of the first transistor, and
in the transition of the input signal from the first voltage to the second voltage, charges in the gate of the first transistor are extracted to the direct current voltage source via the first switch section and the first resistor, and charges in the base of the second transistor are extracted to the direct current voltage source via the extraction diode and the first switch section.

* * * * *